United States Patent
Mo et al.

(10) Patent No.: US 10,243,564 B2
(45) Date of Patent: Mar. 26, 2019

(54) INPUT-OUTPUT RECEIVER

(71) Applicants: Semiconductor Manufacturing International (Shanghai) Corporation, Shanghai (CN); Semiconductor Manufacturing International (Beijing) Corporation, Beijing (CN)

(72) Inventors: Shan Yue Mo, Shanghai (CN); Jie Chen, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 53 days.

(21) Appl. No.: 15/436,911

(22) Filed: Feb. 20, 2017

(65) Prior Publication Data

US 2017/0264297 A1    Sep. 14, 2017

(30) Foreign Application Priority Data

Mar. 9, 2016   (CN) .......................... 2016 1 0134366

(51) Int. Cl.
*H03K 19/0175*    (2006.01)
*H03K 19/0185*    (2006.01)
(Continued)

(52) U.S. Cl.
CPC ... *H03K 19/018521* (2013.01); *H03K 3/3565* (2013.01); *H03K 19/00315* (2013.01); *H03K 19/01721* (2013.01)

(58) Field of Classification Search
CPC .............. H03K 17/14; H03K 17/145; H03K 19/018521; H03K 19/018528; H03K 19/0175

See application file for complete search history.

(56) References Cited

U.S. PATENT DOCUMENTS 4,574,273 A * 3/1986 Atsumi .............. H03K 19/0948
326/81
5,495,185 A    2/1996 Goto
(Continued)

FOREIGN PATENT DOCUMENTS

WO    9642139 A1    12/1996

OTHER PUBLICATIONS

The European Patent Office (EPO) The Extended European Search Report for 17158753.8 dated Jul. 28, 2017 10 Pages.

*Primary Examiner* — Hai L Nguyen
(74) *Attorney, Agent, or Firm* — Anova Law Group, PLLC

(57) ABSTRACT

An input-output (I/O) receiver includes a receiving terminal, a first N-type metal-oxide-semiconductor (NMOS) transistor, a reformation circuit, and a compensation unit. The receiving terminal is coupled with an external voltage signal. The first NMOS transistor has a source electrode coupled with the receiving terminal and a gate electrode coupled with a first power supply voltage. The reformation circuit is configured to reform a voltage signal transmitted from a drain electrode of the first NMOS transistor. The compensation unit includes a first PMOS transistor, a second PMOS transistor, and a second NMOS transistor. Moreover, the compensation unit is configured to provide a compensation voltage to a voltage signal at the drain electrode of the first NMOS transistor thereby a maximum level of the (Continued)

voltage signal at the drain electrode of the first NMOS transistor reaches the first power supply voltage.

18 Claims, 3 Drawing Sheets

(51) Int. Cl.
*H03K 3/3565* (2006.01)
*H03K 19/003* (2006.01)
*H03K 19/017* (2006.01)

(56) References Cited

U.S. PATENT DOCUMENTS

| | | | |
|---|---|---|---|
| 5,541,546 A * | 7/1996 | Okumura | H03K 19/018521 326/63 |
| 6,031,393 A | 2/2000 | Wayner | |
| 8,593,203 B2 * | 11/2013 | Shankar | H03K 19/00315 326/62 |
| 2010/0026363 A1 | 2/2010 | Shankar et al. | |

* cited by examiner

INPUT-OUTPUT RECEIVER

CROSS-REFERENCES TO RELATED APPLICATIONS

This application claims the priority of Chinese Patent Application No. CN201610134366.7, filed on Mar. 9, 2016, the entire content of which is incorporated herein by reference.

FIELD OF THE DISCLOSURE

The present disclosure generally relates to the field of semiconductor integrated circuits (ICs) and, more particularly, relates to input-output receivers and operation mechanism thereof.

BACKGROUND

An input-output (I/O) receiver is an interface circuit for internal and external signal exchange of an IC chip. The main function of an I/O receiver is to receive digital/analog signals. In some applications, the external voltage may be higher than the internal power supply voltage of the chip. Therefore, a voltage resistant circuit is commonly designed in an I/O receiver in order to protect the I/O receiver.

FIG. 1 shows a schematic view of an existing I/O receiver. Referring to FIG. 1, the receiving terminal receives signals from Port PAD. The voltage level Vin at Port PAD is higher than the power supply voltage VDD1 of the receiver. When the signal at Port PAD is directly transmitted to Node B, a high voltage level may cause reliability issues of NMOS transistors M29 and M30. Therefore, the I/O receiver further includes an NMOS transistor M31 to reduce the maximum level of the voltage signal at Node B.

As shown in FIG. 1, the source electrode of the NMOS transistor M31 is coupled with Port PAD, while the gate electrode of the NMOS transistor M31 is coupled with the power supply voltage VDD1. Thus, the voltage level at Node B is controlled in a range between 0 and a value of (VDD1−Vthn), where Vthn is the threshold voltage of NMOS transistor M31. Therefore, introducing the NMOS transistor M31 into the I/O receiver may provide protection for the NMOS transistor M29 and the NMOS transistor M30. Further, the gate electrode of the PMOS transistor M27 is connected to Port PAD so that leakage current from the power supply voltage VDD1 to ground (i.e. Port VSS) may be avoided. Moreover, the voltage-level converting unit reduces the received voltage signal and converts the received voltage signal into an internal voltage signal. The internal voltage signal is transmitted into the internal chip through Port C.

However, in existing I/O receivers, the maximum value of the voltage signal at Node B is (VDD1−Vthn), which cannot reach the operational power supply voltage VDD1 of the I/O receiver. Therefore, the operation speed of the I/O receiver may be reduced and the performance of the I/O receiver may be degraded.

The disclosed I/O receivers are directed to solve one or more problems set forth above and other problems in the art.

BRIEF SUMMARY OF THE DISCLOSURE

One aspect of the present disclosure includes an input-output (I/O) receiver. The I/O receiver includes a receiving terminal, a first N-type metal-oxide-semiconductor (NMOS) transistor, a reformation circuit, and a compensation unit. The receiving terminal is coupled with an external voltage signal. The first NMOS transistor has a source electrode coupled with the receiving terminal and a gate electrode coupled with a first power supply voltage. The reformation circuit is configured to reform a voltage signal transmitted from a drain electrode of the first NMOS transistor. The compensation unit includes a first PMOS transistor, a second PMOS transistor, and a second NMOS transistor. Moreover, the compensation unit is configured to provide a compensation voltage to a voltage signal at the drain electrode of the first NMOS transistor thereby a maximum level of the voltage signal at the drain electrode of the first NMOS transistor reaches the first power supply voltage.

Other aspects of the present disclosure can be understood by those skilled in the an in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 2:
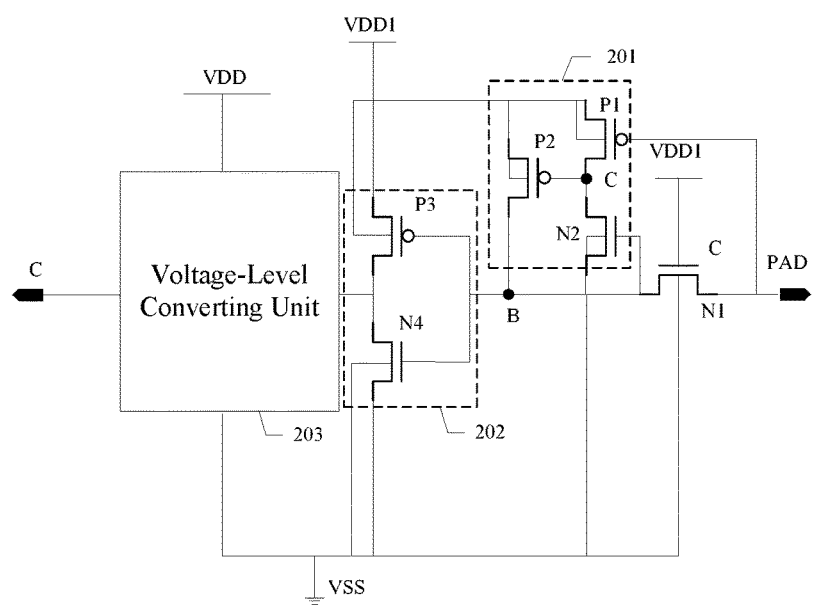
FIG. 2 illustrates a schematic view of a circuit structure of an exemplary I/O receiver consistent with disclosed embodiments.

FIG. 2 shows a schematic view of a circuit structure of an exemplary I/O receiver consistent with disclosed embodiments. Referring to FIG. 2, the I/O receiver may include a receiving terminal (not labeled), a first NMOS transistor N1, a compensation unit 201, a reformation circuit 202, and a voltage-level converting unit 203.

The receiving terminal may be coupled with the external voltage signal transmitted into the I/O receiver through Port PAD. The source electrode of the first NMOS transistor N1 may be coupled with the receiving terminal, while the gate electrode of the first NMOS transistor N1 may be coupled with a first power supply voltage VDD1. The first power supply voltage VDD1 may be the operation voltage level of the I/O receiver. The level of the first power supply voltage VDD1 may be less than the maximum voltage level of the external voltage signal. As shown in FIG. 2, the input terminals of the reformation circuit 202 may be coupled with the first power supply voltage VDD1, the ground VSS, and the drain electrode of the first NMOS transistor N1, respectively. The reformation circuit 202 may be used to reform the voltage signal transmitted from the drain electrode of the first NMOS transistor N1. The input terminals of the compensation unit 201 may be coupled with the first power supply voltage VDD1, the ground VSS, and the receiving terminal, respectively. The output terminal of the compensation unit 201 may be coupled with the drain electrode of the first NMOS transistor N1. The compensation unit 201 may be used to provide a compensation voltage to the voltage signal at the drain electrode of the first NMOS transistor N1 such that the maximum level of the voltage signal at the drain electrode of the first NMOS transistor N1 may reach the first power supply voltage VDD1.

In one embodiment, the compensation unit 201 may include a first PMOS transistor P1, a second PMOS transistor P2, and a second NMOS transistor N2. Specifically, the source electrode of the first PMOS transistor P1 may be coupled with the first power supply voltage VDD1, the drain electrode of the first PMOS transistor P1 may be coupled with the drain electrode of the second NMOS transistor N2, and the gate electrode of the first PMOS transistor P1 may be coupled with the receiving terminal. The gate electrode of the second NMOS transistor N2 may be coupled with the drain electrode of the first NMOS transistor N1 and the source electrode of the second NMOS transistor N2 may be grounded. The source electrode of the second PMOS transistor P2 may be coupled with the first power supply voltage VDD1, the gate electrode of the second PMOS transistor P2 may be coupled with the drain electrode of the first PMOS transistor P1, and the drain electrode of the second PMOS transistor P2 may be coupled with the drain electrode of the first NMOS transistor N1.

In one embodiment, the external voltage signal may be a rectangular wave signal. When the external voltage signal is at a logic-low voltage level while the initial voltage level at Node B is also low, the first PMOS transistor P1 may be turned on and the second NMOS transistor N2 may be turned off. Therefore, the voltage level at Net C may be high and the second PMOS transistor P2 may be turned off.

Further, at a rising edge where the external voltage signal rises from a logic-low voltage level to a logic-high voltage level, the first PMOS transistor P1 may be turned off, while the second NMOS transistor N2 may be turned on. The drain electrode of the first PMOS transistor P1 may then be grounded through the second NMOS transistor N2. Thus, the voltage level of the drain electrode of the first PMOS transistor P1 may be pulled down. When the voltage level at Net C drops to be less than or equal to the threshold voltage of the second PMOS transistor P2, the second PMOS transistor P2 may be turned on so that the voltage level at Node B may reach the first power supply voltage VDD1.

Moreover, at a falling edge where the external voltage signal falls down from a logic-high voltage level to a logic-low voltage level, the first PMOS transistor P1 may be turned on, while the second NMOS transistor N2 may be turned off. The voltage level at the drain electrode of the first PMOS transistor P1 may increase. When the voltage level at Net C rises to be greater than the threshold voltage of the second PMOS transistor P2, the second PMOS transistor P2 may be turned off so that the voltage level at Node B may drop to a logic-low voltage level.

Specifically, a short current may flow from the first power supply voltage VDD1 to the ground VSS on the falling edge of the receiving signal through the second NMOS transistor N2. When the voltage level at Node B reaches the first power supply voltage VDD1, the driving speed may be fast and the energy consumption may be low.

Further, after the external voltage signal passes through the compensation unit 201, the rising edge and the falling edge of the voltage signal at Node B may become moderate. The shape of the voltage signal may then be reformed through the reformation circuit 202. After the reformation, the rising edge and the falling edge of the voltage signal may become sharp.

The reformation circuit 202 may be an inverter unit. In one embodiment, the inverter unit 202 may include a third PMOS transistor P3 and a fourth NMOS transistor N4. Specifically, the source electrode of the third PMOS transistor P3 may be coupled with the first power supply voltage VDD1, and the gate electrode of the third PMOS transistor P3 may be coupled with the drain electrode of the first NMOS transistor N1. The drain electrode of the fourth NMOS transistor N4 may be coupled with the drain electrode of the third PMOS transistor P3, the source electrode of the fourth NMOS transistor N4 may be grounded, and the gate electrode of the fourth NMOS transistor N4 may be coupled with the drain electrode of the first NMOS transistor N1. In other embodiments, the inverter unit may have any other appropriate circuit structure.

In one embodiment, the gate electrode of the third PMOS transistor P3 and the gate electrode of the fourth NMOS transistor N4 together may serve as an input terminal of the inverter unit 202 and may be coupled with Node B, while the drain electrode of the third PMOS transistor P3 and the drain electrode of the fourth NMOS transistor N4 together may serve as an output terminal of the inverter unit 202 and may be coupled with an input terminal of the voltage-level converting unit 203.

When the voltage signal at Node B rises from a logic-low voltage level to a logic-high voltage level, the third PMOS transistor P3 may be turned off while the fourth NMOS transistor N4 may be turned on. As the voltage signal at Node B stays at a logic-high voltage level, the ground VSS may pull down the voltage level at the output terminal of the inverter unit 202 to a logic-low voltage level. Further, when the voltage signal at Node B falls from the logic-high voltage level to the logic-low voltage level, the third PMOS transistor P3 may turned on while the fourth NMOS transistor N4 may turned off. As a result, the first power supply voltage may drive the output terminal of the inverter unit 202 to a logic-high voltage level.

Further, the I/O receiver may include a voltage-level converting unit 203. Specifically, a second power supply voltage VDD of the voltage-level converting unit 203 may be the operation voltage level of the chip. In one embodiment, the second power supply voltage VDD may be less than the first power supply voltage VDD1. Therefore, the output voltage signal of the I/O receiver may need to be converted to a signal in compliance with the power voltage of the chip through the voltage-level converting unit 203. The converted voltage signal may then be transmitted to the chip through Port C. The voltage-level converting unit may have any appropriate circuit structure to realize the desired voltage conversion.

Figure 3:
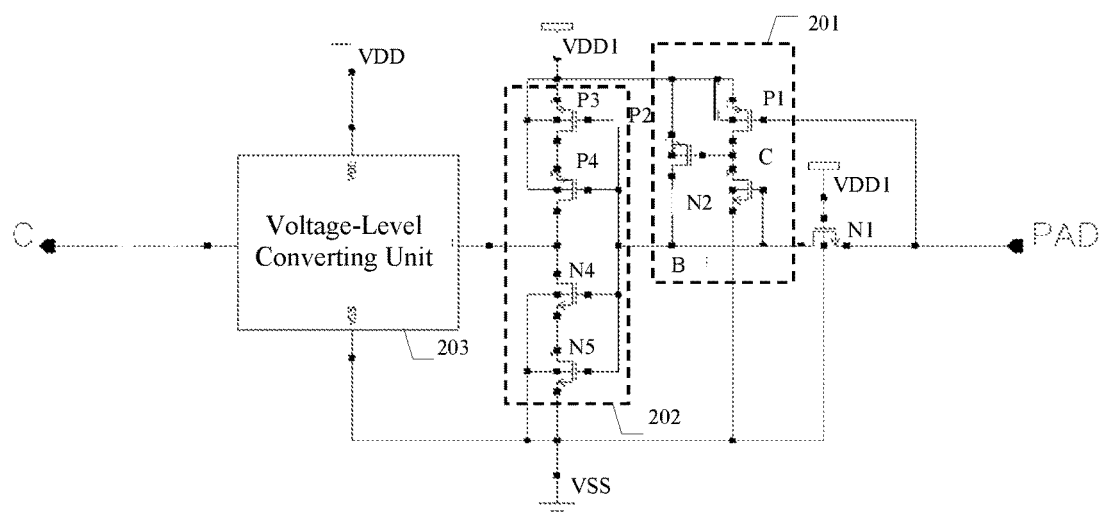
FIG. 3 illustrates a schematic view of a circuit structure of another exemplary I/O receiver consistent with disclosed embodiments.

FIG. 3 shows a schematic view of the circuit structure of another exemplary I/O receiver consistent with disclosed embodiments. Referring to FIG. 3, the I/O receiver may include a receiving terminal (not labeled), a first NMOS transistor N1, a compensation unit 201, a reformation circuit 202, and a voltage-level converting unit 203.

In one embodiment, the reformation unit 202 may be an inverter unit. Specifically, the circuit structure of the inverter unit may include a third PMOS transistor P3, a fourth PMOS transistor P4, and a fifth PMOS transistor P5. The source electrode of the third PMOS transistor P3 may be coupled with a first power supply voltage VDD1, and the gate electrode of the third PMOS transistor may be coupled with the drain electrode of the first NMOS transistor N1. The source electrode of the fourth PMOS transistor P4 may be coupled with the drain electrode of the third PMOS transistor P3, and the gate electrode of the fourth PMOS transistor P4 may be coupled with the drain electrode of the first NMOS transistor N1. The drain electrode of the fourth NMOS transistor N4 may be coupled with the drain electrode of the fourth PMOS transistor P4, and the gate electrode of the fourth NMOS transistor N4 may be coupled with the drain electrode of the first NMOS transistor N1. Moreover, the drain electrode of the fifth NMOS transistor N5 may be coupled with the source electrode of the fourth NMOS transistor N4, the source electrode of the fifth NMOS transistor N5 may be grounded, and the gate electrode of the fifth NMOS transistor N5 may be coupled with the drain electrode of the first NMOS transistor N1.

Specifically, the gate electrodes of the third PMOS transistor P3, the fourth PMOS transistor P4, the fourth NMOS transistor N4, and the fifth NMOS transistor N5 may together serve as an input terminal of the inverter unit and may be coupled with Node B, while the drain electrodes of the fourth PMOS transistor P4 and the fourth NMOS transistor N4 may together serve as an output terminal of the inverter unit and may be coupled with the voltage-level converting unit 203.

When the voltage signal at Node B rises from a logic-low voltage level to a logic-high voltage level, the third PMOS transistor P3 and the fourth PMOS transistor P4 may be turned off, while the fourth NMOS transistor N4 and the fifth NMOS transistor N5 may be turned on. As such, the ground VSS may pull down the voltage signal at the output terminal of the inverter unit to a logic-low voltage level. Moreover, when the voltage signal at Node B falls down from a logic-high voltage level to a logic-low voltage signal, the third PMOS transistor P3 and the PMOS transistor P4 may be turned on while the fourth NMOS transistor N4 and the fifth NMOS transistor N5 may be turned off. Therefore, a first power supply voltage VDD1 may drive the voltage signal at the output terminal of the inverter unit to a logic-high voltage level.

In other embodiments, the reformation circuit 202 may also be a Schmitt trigger. The Schmitt trigger may have any appropriate circuit structure. The reformation circuit 202 may be used to filter out noise and reform the shape for the output signal at Node B.

Further, the inverter unit and the Schmitt trigger are both threshold switching circuits. Such a gate circuit with abrupt I/O characteristics may prevent changes in the output voltage due to a subtle variation in the input voltage (e.g., a change in the input voltage below a threshold value). Further, through a positive feedback during the voltage conversion process, a periodic signal with slowly-changed edges may be reformed to a pulsed rectangular wave signal with sharp rising and falling edges. Specifically, as long as the amplitude of the input signal reaches the turn-on threshold voltage of the MOS transistor, the output terminal may send out a pulsed rectangular wave signal with the same frequency as the input periodic signal. Further, any electric circuit realizing the desired signal reformation may be regarded as a reformation circuit consistent with the disclosed embodiments.

Other aspects of the I/O receiver shown in FIG. 3, including the compensation unit 201 and the voltage-level converting unit 203, are similar to the corresponding components of the I/O receiver shown in FIG. 2. One may refer to the description above for details.

Figure 4:
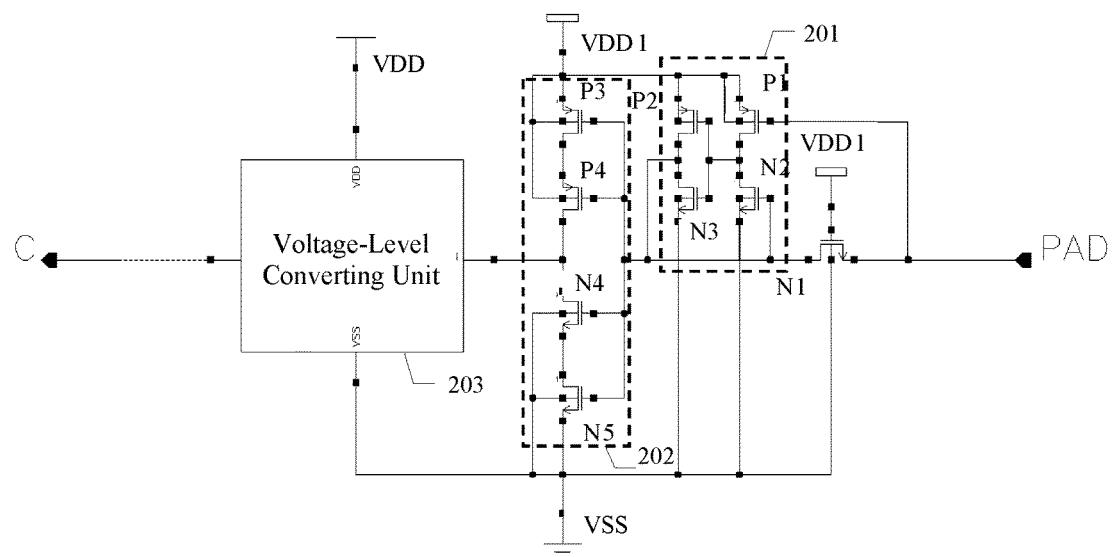
FIG. 4 illustrates a schematic view of a circuit structure of another exemplary I/O receiver consistent with disclosed embodiments.

FIG. 4 shows a schematic view of the circuit structure of another exemplary I/O receiver consistent with the disclosed embodiments. Referring to FIG. 4, the I/O receiver may include a receiving terminal (not labeled), a first NMOS transistor N1, a compensation unit 201, a reformation circuit 202, and a voltage-level converting unit 203.

In one embodiment, the compensation unit 201 may include a first PMOS transistor P1, a second PMOS transistor P2, a second NMOS transistor N2, and a third NMOS transistor N3. The source electrode of the first PMOS transistor P1 may be coupled with the first power supply voltage VDD1, the drain electrode of the first PMOS transistor P1 may be coupled with the drain electrode of the second NMOS transistor N2, and the gate electrode of the first PMOS transistor P1 may be coupled with the receiving terminal. The source electrode of the second PMOS transistor P2 may be coupled with the first power supply voltage VDD1, while the gate electrode of the second PMOS transistor P2 may be coupled with the drain electrode of the first PMOS transistor P1. The drain electrode of the third NMOS transistor N3 may be coupled with the drain electrode of the second PMOS transistor P2 and also to the drain electrode of the first NMOS transistor N1, the gate electrode of the third NMOS transistor N3 may be coupled with the drain electrode of the first PMOS transistor P1, and the source electrode of the third NMOS transistor may be grounded.

In one embodiment, the external voltage signal may be a rectangular wave signal. When the external voltage signal rises from the logic-low voltage level to the logic-high voltage level, the first PMOS transistor P1 may be turned off, while the second NMOS transistor N2 may be turned on. The drain electrode of the first PMOS transistor P1 may then be grounded through the second NMOS transistor N2. Thus, the voltage level of the drain electrode of the first PMOS transistor P1 may be pulled down. When the voltage level at the drain electrode of the first PMOS transistor P1 drops to be less than or equal to the threshold voltage of the second PMOS transistor P2, the second PMOS transistor P2 may be turned on, while the third NMOS transistor N3 may be turned off. As such, the first power supply voltage VDD1 may drive the output voltage at the drain electrode of the first NMOS transistor N1 to reach the first power supply voltage VDD1 through the second PMOS transistor P2.

Moreover, when the external voltage signal falls down from the logic-high voltage level to the logic-low voltage level, the first PMOS transistor P1 may be turned on, while the second NMOS transistor N2 may be turned off. The voltage level at the drain electrode of the first PMOS transistor P1 may then increase. When the voltage level at the drain electrode of the first PMOS transistor P1 becomes greater than the threshold voltage of the second PMOS transistor P2, the second PMOS transistor P2 may be turned off, while the third NMOS transistor may be turned on. The ground voltage VSS may drive the output voltage at the drain electrode of the first NMOS transistor N1 to the logic-low voltage level through the third NMOS transistor N3.

Other aspects of the I/O receiver shown in FIG. 4, including the reformation circuit 202 and the voltage-level converting unit 203, are similar to the corresponding components of the I/O receiver shown in FIG. 3. One may refer to the description above for details.

Figure 1:
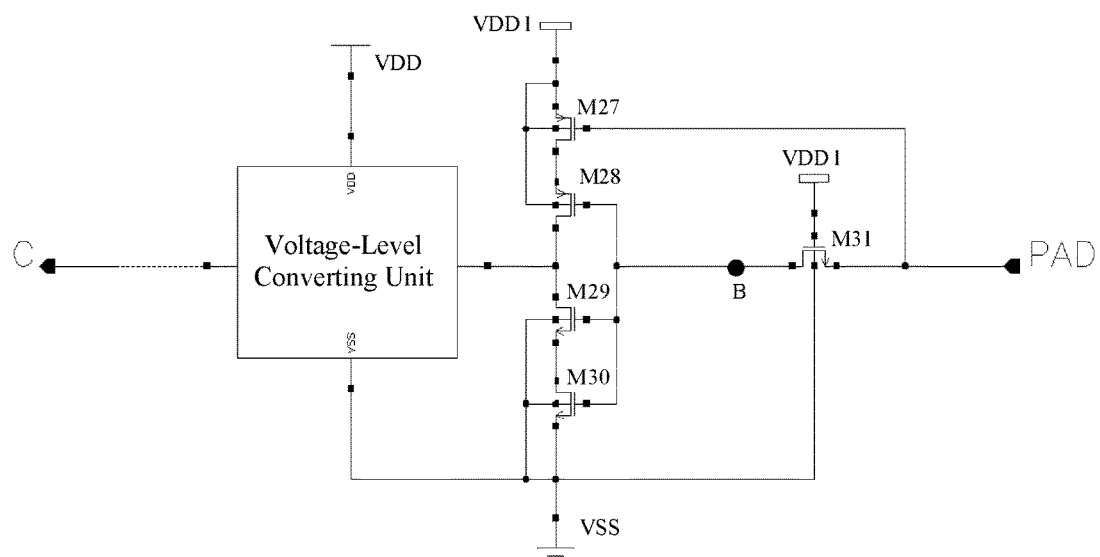
FIG. 1 illustrates a schematic view of the circuit structure of an existing I/O receiver.
Figure 5:
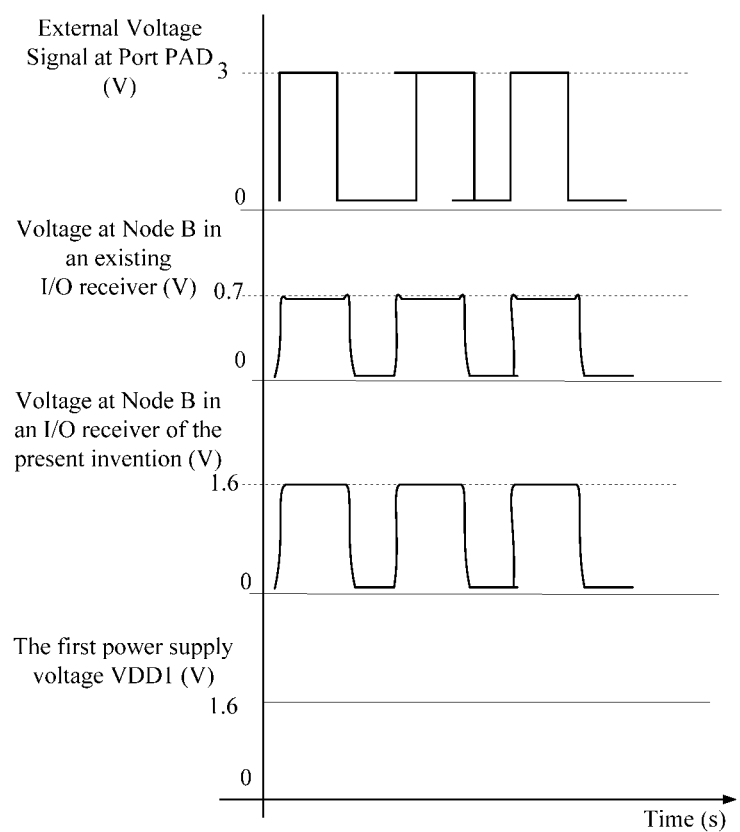
FIG. 5 illustrates simulated voltage profiles at certain positions in an exemplary I/O receiver consistent with disclosed embodiments and also in an existing I/O receiver.

FIG. 5 shows simulated voltage profiles at certain positions in the I/O receiver shown in FIG. 2 and also in the existing I/O receiver shown in FIG. 1.

Referring to FIG. 5 and FIGS. 1-2, the simulations are performed by using 1.6 V for the first power supply voltage VDD1 and 3 V for the high voltage level of the external voltage signal. In addition, a threshold voltage (i.e. Vthn) of 0.9 V is assumed for both the NMOS transistor M3 in the existing I/O receiver and the NMOS transistor N1 in the disclosed I/O receiver.

Referring to FIG. 5, for the existing I/O receiver shown in FIG. 1, the output voltage of the NMOS transistor M31. i.e. the voltage signal at Node B, may be in a range between 0 V and 0.7 V. That is, the maximum voltage level at Node B may only reach VDD1−Vthn. In such a case, the I/O receiver may still work, but the performance of the I/O receiver may be degraded. For the I/O receiver shown in FIG. 2, the voltage signal at Node B may be in a range between 0 V and 1.6 V. That is, the maximum voltage level at Node B may reach the first power supply voltage VDD1. Therefore, the performance of the I/O receiver may be desired and the working condition of the reformation unit may also be optimized. Therefore, according to the present disclosure, by raising the high voltage level output of the first NMOS transistor N1 to the first power supply voltage VDD1 through a compensation unit, the performance of the I/O receiver may be improved while the complexity of the circuit structure may not be increased.

Compared to existing I/O receivers, the disclosed I/O receivers may demonstrate the following advantages.

According to the present disclosure, each I/O receiver consistent with the disclosed embodiments may include a receiving terminal, a first NMOS transistor, a reformation circuit, and a compensation unit. The receiving terminal may be coupled with an external voltage signal. The source electrode of the first NMOS transistor may be coupled with the receiving terminal while the gate electrode of the first NMOS transistor may be coupled with a first power supply voltage. The input terminals of the reformation circuit may be coupled with the first power supply voltage, the ground, and the drain electrode of the first NMOS transistor, respectively. The reformation circuit may be used to reform the voltage signal transmitted from the drain electrode of the first NMOS transistor.

Moreover, according to an I/O receiver consistent with the disclosed embodiments, the compensation unit may further include a first PMOS transistor, a second PMOS transistor, and a second NMOS transistor. Specifically, the source electrode of the first PMOS transistor may be coupled with the first power supply voltage, the drain electrode of the first PMOS transistor may be coupled with the drain electrode of the second NMOS transistor, and the gate electrode of the first PMOS transistor may be coupled with the receiving terminal. The gate electrode of the second NMOS transistor may be coupled with the drain electrode of the first NMOS transistor and the source electrode of the second NMOS transistor may be grounded. Moreover, the source electrode of the second PMOS transistor may be coupled with the first power supply voltage, the gate electrode of the second PMOS transistor may be coupled with the drain electrode of the first PMOS transistor, and the drain electrode of the second PMOS transistor may be coupled with the drain electrode of the first NMOS transistor.

Further, when the receiving terminal receives a high voltage level signal, the first PMOS transistor may be turned off while the second NMOS transistor may be turned on. Therefore, the voltage level at the drain electrode of the first PMOS transistor may be pulled down through the second NMOS transistor. Moreover, because the drain electrode of the first PMOS transistor may be coupled with the gate electrode of the second PMOS transistor, the second PMOS transistor may then be turned on. Since the drain electrode of the second PMOS transistor may be coupled with the drain electrode of the first NMOS transistor, the voltage at the drain electrode of the first NMOS transistor may reach the operation power supply voltage of the I/O receiver. That is, the compensation unit may provide a compensation voltage to the voltage signal at the drain electrode of the first NMOS transistor such that the maximum level of the voltage signal at the drain electrode of the first NMOS transistor may reach the first power supply voltage. Therefore, with a simple circuit structure, the disclosed I/O receiver accepts external high voltage inputs and also improves the speed and performance of the I/O circuit.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An input-output (I/O) receiver, comprising:
   a receiving terminal, coupled with an external voltage signal;
   a first NMOS transistor, having a source electrode coupled with the receiving terminal and a gate electrode coupled with a first power supply voltage;
   a reformation circuit including a third PMOS transistor and a fourth NMOS transistor, configured to reform a voltage signal transmitted from a drain electrode of the first NMOS transistor; and
   a compensation unit, including a first PMOS transistor, a second PMOS transistor, and a second NMOS transistor, configured to provide a compensation voltage to a voltage signal at the drain electrode of the first NMOS transistor thereby a maximum level of the voltage signal at the drain electrode of the first NMOS transistor reaches the first power supply voltage, wherein a gate electrode of the first PMOS transistor is connected with the receiving terminal.

2. The I/O receiver according to claim 1, wherein:
   a source electrode of the first PMOS transistor is coupled with the first power supply voltage and a gate electrode of the first PMOS transistor is directly connected with the receiving terminal; and
   a drain electrode of the second NMOS transistor is coupled with a drain electrode of the first PMOS transistor, a gate electrode of the second NMOS transistor is coupled with the drain electrode of the first NMOS transistor, and a source electrode of the second NMOS transistor is connected to ground.

3. The I/O receiver according to claim 2, wherein:
   a source electrode of the second PMOS transistor is coupled with the first power supply voltage, a gate electrode of the second PMOS transistor is coupled with the drain electrode of the first PMOS transistor, and a drain electrode of the second PMOS transistor is coupled with the drain electrode of the first NMOS transistor.

4. The I/O receiver according to claim 2, wherein:
   the compensation unit further includes a third NMOS transistor; and a drain electrode of the third NMOS transistor is coupled with the drain electrode of the second PMOS transistor and the drain electrode of the first NMOS transistor, a gate electrode of the third NMOS transistor is coupled with the drain electrode of the first PMOS transistor, and a source electrode of the third NMOS transistor is grounded.

5. The I/O receiver according to claim 3, wherein when the external voltage signal increases from a logic-low voltage level to a logic-high voltage level:
the first PMOS transistor is turned off;
the second NMOS transistor is turned on;
a voltage level at the drain electrode of the first PMOS transistor is pulled down through the second NMOS transistor; and
when the voltage level at the drain electrode of the first PMOS transistor becomes less than or equal to a threshold voltage of the second PMOS transistor, the second PMOS transistor is turned on to let the output voltage level at the drain electrode of the first NMOS transistor reach the first power supply voltage.

6. The I/O receiver according to claim 3, wherein when the external voltage signal decreases from a logic-high voltage level to a logic-low voltage level:
the first PMOS transistor is turned on;
the second NMOS transistor is turned off;
the voltage level at the drain electrode of the first PMOS transistor increases; and
when the voltage level at the drain electrode of the first PMOS transistor becomes higher than the threshold voltage of the second PMOS transistor, the second PMOS transistor is turned off to let the output voltage level at the drain electrode of the first NMOS transistor drop to the logic-low voltage level.

7. The I/O receiver according to claim 4, wherein when the external voltage signal increases from a logic-low voltage level to a logic-high voltage level:
the first PMOS transistor is turned off;
the second NMOS transistor is turned on;
a voltage level at the drain electrode of the first PMOS transistor is pulled down through the second NMOS transistor; and
when the voltage level at the drain electrode of the first PMOS transistor becomes less than or equal to a threshold voltage of the second PMOS transistor, the second PMOS transistor is turned on and the third NMOS transistor is turned off to let the output voltage level at the drain electrode of the first NMOS transistor reach the first power supply voltage.

8. The I/O receiver according to claim 7, wherein when the external voltage signal decreases from a logic-high voltage level to a logic-low voltage level:
the first PMOS transistor is turned on;
the second NMOS transistor is turned off;
the voltage level at the drain electrode of the first PMOS transistor increases; and
when the voltage level at the drain electrode of the first PMOS transistor becomes higher than the threshold voltage of the second PMOS transistor, the second PMOS transistor is turned off and the third NMOS transistor is turned on to let the output voltage level at the drain electrode of the first NMOS transistor drop to the logic-low voltage level.

9. The I/O receiver according to claim 1, wherein the reformation circuit is an inverter unit.

10. The I/O receiver according to claim 9, wherein:
a source electrode of the third PMOS transistor is coupled with the first power supply voltage while a gate electrode of the third PMOS transistor is coupled with the drain electrode of the first NMOS transistor; and
a drain electrode of the fourth NMOS transistor is coupled with the drain electrode of the third PMOS transistor, a source electrode of the fourth NMOS transistor is grounded, and a gate electrode of the fourth NMOS transistor is coupled with the drain electrode of the first NMOS transistor.

11. The I/O receiver according to claim 10, wherein when the external voltage signal increase from a logic-low voltage level to a logic-high voltage level:
the third PMOS transistor of the inverter unit is turned off;
the fourth NMOS transistor of the inverter unit is turned on; and
the ground pulls down an output voltage of the inverter unit to a logic-low voltage level.

12. The I/O receiver according to claim 11, wherein when the external voltage signal decreases from a logic-high voltage level to a logic-low voltage level:
the third PMOS transistor of the inverter unit is turned on;
the fourth NMOS transistor of the inverter unit is turned off; and
the first power supply voltage drives an output voltage of the inverter unit to a logic-high voltage level.

13. The I/O receiver according to claim 9, wherein:
the inverter unit further includes a fourth PMOS transistor, and a fifth NMOS transistor;
a source electrode of the third PMOS transistor is coupled with the first power supply voltage while a gate electrode of the third PMOS transistor is coupled with the drain electrode of the first NMOS transistor;
a source electrode of the fourth PMOS transistor is coupled with a drain electrode of the third PMOS transistor while a gate electrode of the fourth PMOS transistor is coupled with the drain electrode of the first NMOS transistor;
a drain electrode of the fourth NMOS transistor is coupled with a drain electrode of the fourth PMOS transistor while a gate electrode of the fourth NMOS transistor is coupled with the drain electrode of the first NMOS transistor; and
a drain electrode of the fifth NMOS transistor is coupled with a source electrode of the fourth NMOS transistor, a source electrode of the fifth NMOS transistor is grounded, and a gate electrode of the fourth NMOS transistor is coupled with the drain electrode of the first NMOS transistor.

14. The I/O receiver according to claim 13, wherein when the external voltage signal increases from a logic-low voltage level to a logic-high voltage level:
the third PMOS transistor and the fourth PMOS transistor of the inverter unit are turned off;
the fourth NMOS transistor and the fifth NMOS transistor of the inverter unit is turned on; and
the ground pulls down an output voltage of the inverter unit to a logic-low voltage level.

15. The I/O receiver according to claim 14, wherein when the external voltage signal decreases from a logic-high voltage level to a logic-low voltage level:
the third PMOS transistor and the fourth PMOS transistor of the inverter unit is turned on;
the fourth NMOS transistor and the fifth NMOS transistor of the inverter unit is turned off; and
the first power supply voltage drives an output voltage of the inverter unit to a logic-high voltage level.

16. The I/O receiver according to claim 1, wherein the reformation circuit has an input terminal coupled with the drain electrode of the first NMOS transistor.

17. The I/O receiver according to claim 1, wherein the reformation circuit is a Schmitt trigger.

18. The I/O receiver according to claim 1, further including:
- a voltage-level converting unit, configured to convert a voltage level of an output signal of the reformation circuit, wherein:
- an input terminal of the voltage-level converting unit is coupled with an output terminal of the reformation circuit and a second power supply voltage; and
- an output terminal of the voltage-level converting unit serves as an output terminal of the I/O receiver.

* * * * *